(12) United States Patent
Senatori et al.

(10) Patent No.: US 9,198,311 B2
(45) Date of Patent: Nov. 24, 2015

(54) LATCH AND PANELS OF COMPUTING SYSTEMS

(75) Inventors: Mark David Senatori, The Woodlands, TX (US); Ilchan Lee, Houston, TX (US); Kevin Massaro, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 160 days.

(21) Appl. No.: 14/127,961

(22) PCT Filed: Jun. 30, 2011

(86) PCT No.: PCT/US2011/042524
§ 371 (c)(1),
(2), (4) Date: Dec. 19, 2013

(87) PCT Pub. No.: WO2013/002796
PCT Pub. Date: Jan. 3, 2013

(65) Prior Publication Data
US 2014/0117826 A1    May 1, 2014

(51) Int. Cl.
*G06F 1/16*        (2006.01)
*H05K 5/02*       (2006.01)

(52) U.S. Cl.
CPC ............ *H05K 5/0221* (2013.01); *G06F 1/1633* (2013.01); *G06F 1/1656* (2013.01); *Y10T 29/49815* (2015.01)

(58) Field of Classification Search
USPC ........... 345/179, 168, 1.3, 1.1, 211, 156, 183, 345/173, 659, 90, 539, 545; 165/104.21, 165/100, 104.31, 104.33, 80.1, 185; 713/340, 1, 323, 2, 300, 320, 34, 321, 713/193, 600, 401, 182, 400; 312/223.2, 312/223.5, 215, 332.1, 216, 222; 361/679.09, 679.58, 679.47, 679.31, 361/679.54, 679.48, 679.6, 690, 704, 719, 361/679.17, 679.33, 679.46, 679.37, 361/679.27, 679.55, 679.4, 679.15, 679.11, 361/679.5, 679.43, 679.41, 679.02; 292/335.3
See application file for complete search history.

(56) References Cited

U.S. PATENT DOCUMENTS

| 6,494,070 | B1 * | 12/2002 | Moss et al. ...................... 70/423 |
| 7,405,927 | B2 * | 7/2008 | Lev ........................... 361/679.55 |
| 7,542,052 | B2 * | 6/2009 | Solomon et al. .............. 345/659 |
| 7,835,150 | B2 | 11/2010 | Degner et al. |
| 2005/0092632 | A1 | 5/2005 | Stanton et al. |
| 2008/0036218 | A1 | 2/2008 | Liang |

(Continued)

FOREIGN PATENT DOCUMENTS

| CN | 102088830 A | 6/2011 |
| KR | 10-2009-0041643 A | 4/2009 |
| TW | M399580 U | 3/2011 |

OTHER PUBLICATIONS

International Search Report and Written Opinion, International Application No. PCT/US2011/042524, Date of Completion: Feb. 15, 2012, Date of Mailing: Feb. 24, 2012, pp. 1-8.

*Primary Examiner* — Hung Duong
(74) *Attorney, Agent, or Firm* — HP Legal Department

(57) ABSTRACT

A latch having an idle position, a first position, and a second position is associated with a first panel and a second panel of a computing system. The first panel is associated with the latch being positioned in the first position. The second panel is associated with the latch being positioned in the second position.

15 Claims, 11 Drawing Sheets

(56) References Cited

U.S. PATENT DOCUMENTS

2009/0177908 A1 7/2009 Baarman et al.
2010/0091442 A1 4/2010 Theobald et al.
2010/0091454 A1 4/2010 Degner et al.
2011/0012483 A1 1/2011 Tang et al.

* cited by examiner

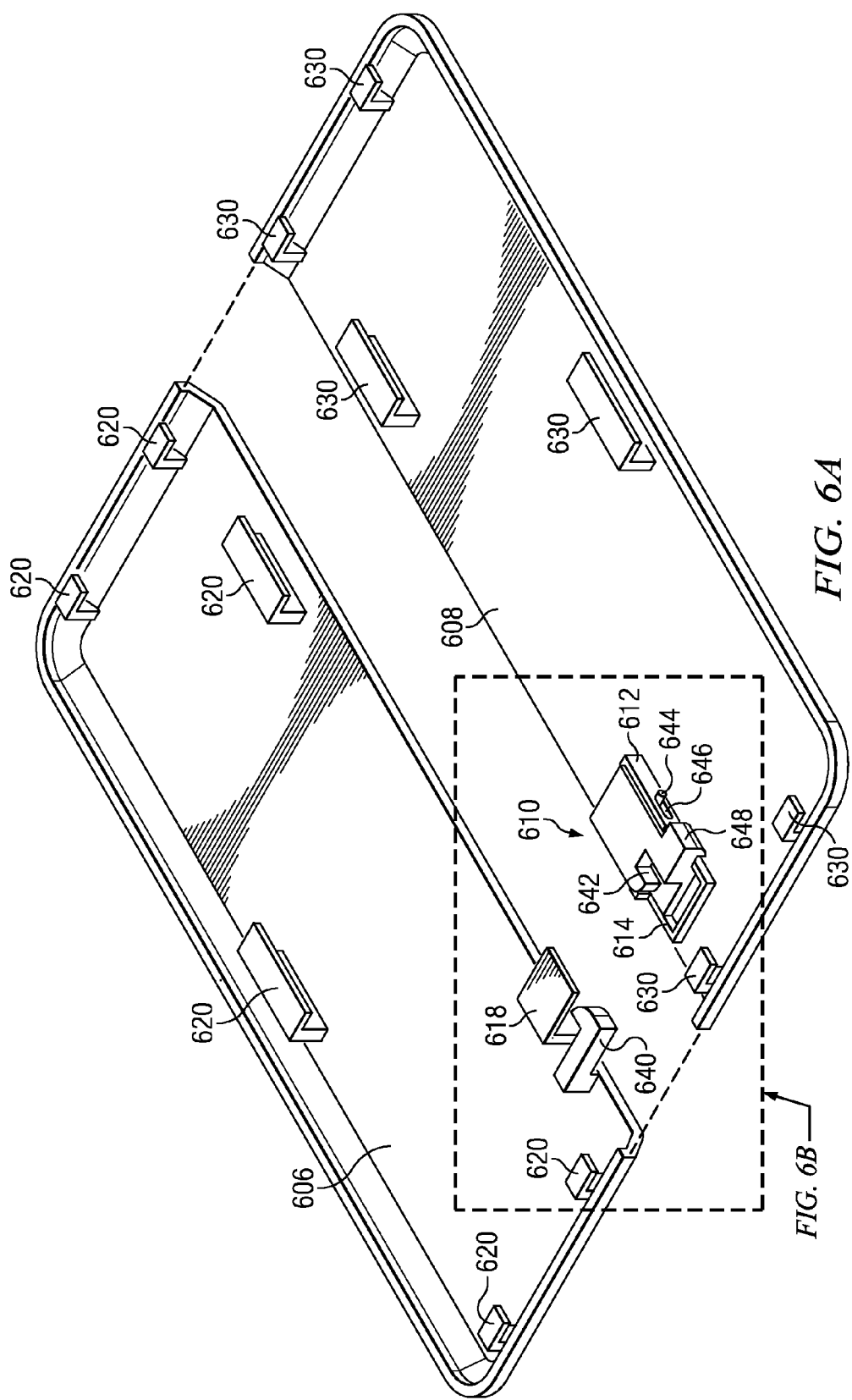

LATCH AND PANELS OF COMPUTING SYSTEMS

BACKGROUND

Portable devices such as notebook/laptop computers can include housing panels to access internal compartments of the portable device. For example, a notebook computer can have a service door to access a battery, and a service door to access random access memory (RAM). Latches or tool-operated fasteners to access the internal portions of the portable device can increase the visual and physical complexity of the housing, as well as the difficulty in accessing internal components.

BRIEF DESCRIPTION OF THE DRAWINGS/FIGURES

FIG. 6A is a perspective view of a latch and panels according to an example.

The present examples will now be described with reference to the accompanying drawings.

DETAILED DESCRIPTION

Portable devices can include housing panels for independently accessing portions of the portable device. However, it is desirable to improve the aesthetics and efficiency of construction and operation of the access panels for the portable device. Furthermore, it is desirable that informational labels, if concealed behind a panel, are accessible without the use of tools. A latch is provided that is operable without the use of tools, and that provides multiple functions to independently and/or simultaneously release or retain panels that are installable on the portable device for accessing compartments or other portions of the portable device. The latch can include multiple positions, can be biased toward or away from a position, and can include a detent associated with a position and/or a transition. Thus, the latch can provide an efficient and visually pleasing solution to independently access multiple portions of a portable device.

Figure 1:
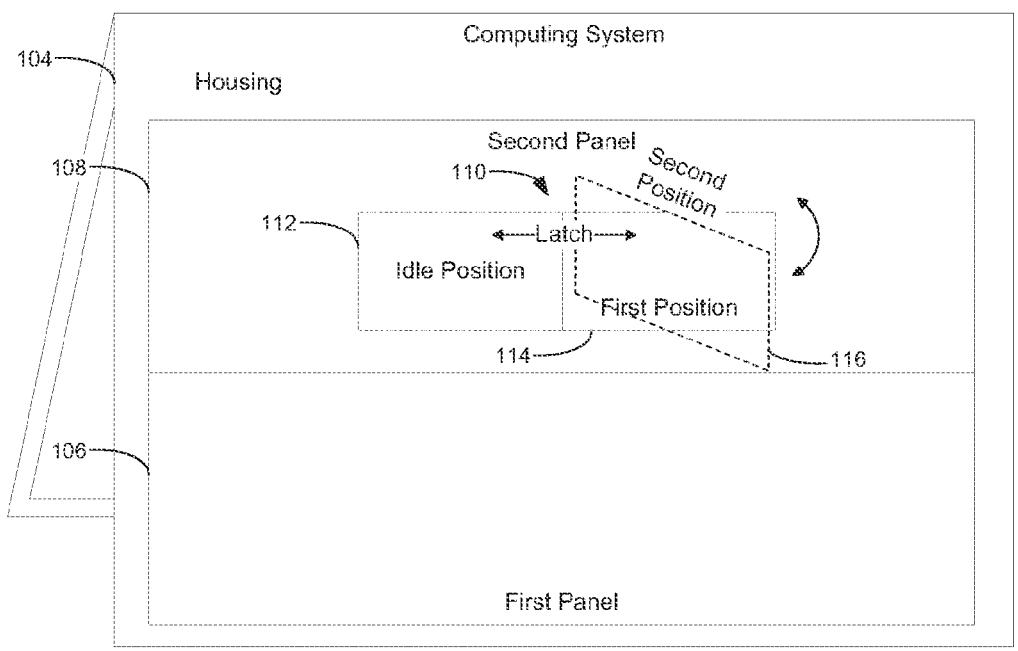
FIG. 1 is a block diagram of a computing system including a latch and panels according to an example.

FIG. 1 is a block diagram of a computing system 100 including a latch and panels according to an example. Computing system 100 can be a laptop or notebook computer, or other portable device such as a netbook or tablet. Computing system 100 includes a housing 104. Access to portions of computing system 100 can be provided by using removable first panel 106 and removable second panel 108. First panel 106 and second panel 108 are independently secured to housing 104 of computing system 100 by latch 110. Elements of the various figures are not shown to scale, and latch(es) or panel(s) can be of any size, orientation, or configuration. In an example, housing 104 includes compartments for a battery, a storage device such as a hard disk drive (HDD) or solid-state disk (SSD), memory such as random access memory (RAM), and various types of expansion cards such as wireless networking or Bluetooth expansion cards.

It may be desirable to access one compartment more frequently than another. For example, it may be desirable to frequently access the battery compartment to swap out the battery, and infrequently access the memory compartment to upgrade the memory. Thus, the battery compartment can be associated with first panel 106 for frequent access, and the memory compartment can be associated with second panel 108 for infrequent access. Latch 110 can provide varying degrees of accessibility to the first panel 106 and second panel 108, as set forth below. Components more likely to be upgraded can be associated with panels having a higher degree of accessibility, and components less likely to be upgraded can be associated with panels having a lower degree of accessibility.

Latch 110 includes an idle position 112, a first position 114, and a second position 116. Each position can be associated with a function, such as releasing or retaining a panel. Latch 110 can be slidable, rotatable, pivotable, depressible, or otherwise movable from one position to another. In the illustrated example of FIG. 1, latch 110 is slidable between the idle position 112 and first position 114, and pivotable between the first position 114 and the second position 116. Thus, three separate positions and associated functions are available using latch 110.

Furthermore, associating different motions to different latch positions can be useful to prevent accidental movement from one latch position to another. The sliding motion of latch 110 from the idle position 112 is terminated upon reaching the first position 114, because the latch is not further slidable to the second position 116. Thus, a user is provided with intuitive feedback as to the operation of the latch, avoiding accidental operation and instilling confidence that the desired latch operation/position was achieved without accidentally opening a panel that was not intended to be opened. Other techniques can be used to avoid accidental latch movements from one latch position to another, such as increased resistance, detents, and other mechanisms to avoid movement and/or to provide feedback to avoid movement.

Latch 110 is disposed in second panel 108, such that removal of second panel 108 includes removal of latch 110. Latch 110 also can be disposed in housing 104 or elsewhere on computing system 100. A benefit of including latch 110 in a panel is that the latch 110 can be replaced with replacement of the associated panel, if the latch 110 is broken, for example.

Latch 110 is operable by hand, without the use of tools, to remove multiple panels of computing system 100. Accordingly, informational labels can be placed under the protection of first panel 106 and second panel 108 such that the labels are accessible without the use of tools. Furthermore, the multi-position, multi-function latch 110 reduces a need for multiple latches on computing system 100, avoiding visual clutter and decreased aesthetics associated with multiple latches and/or fasteners. Thus, computing system 100 can retain a sleek and minimalist appearance while providing multiple independently operable access panels. A single latch also can provide benefits regarding the Americans with Disabilities Act (ADA) or other disability requirements, because the latch 110 can be operated with one hand to remove a panel.

Figure 2:
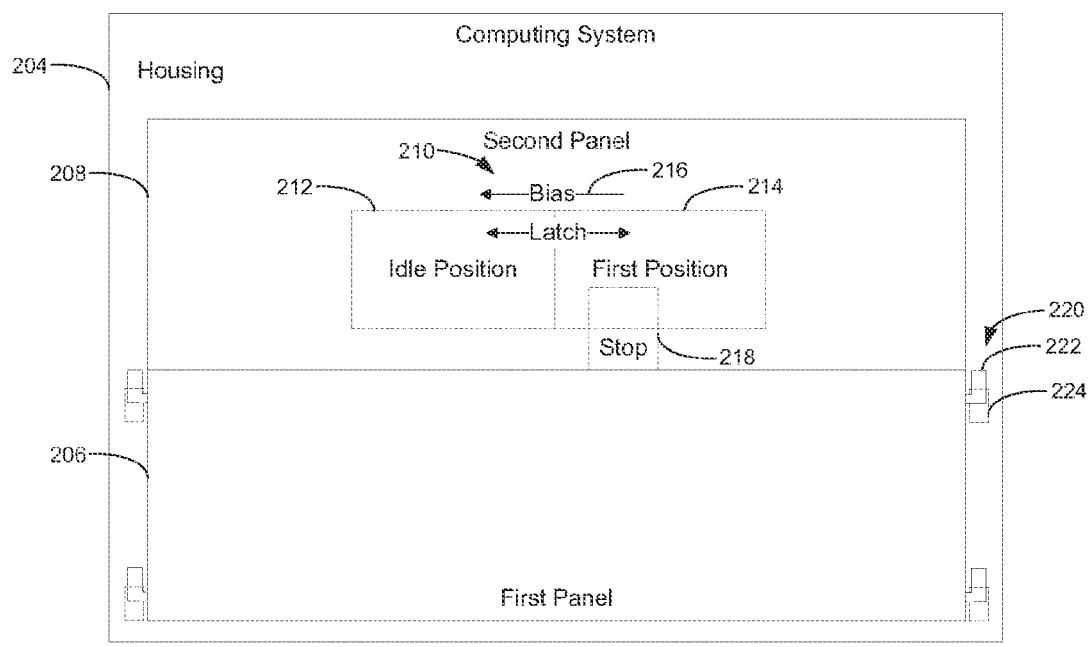
FIG. 2 is a block diagram of a computing system including a latch and panels according to an example.

FIG. 2 is a block diagram of a computing system 200 including a latch and panels according to another example. Housing 204 includes first panel 206, second panel 208, and latch 210. Latch 210 includes an idle position 212 and a first position 214.

Latch 210 can include a bias 216, to bias the latch 210 toward the idle position 212. Accordingly, latch 210 assumes the idle position 212 by default, and will return to the idle position 212 when released in the first position 214. Bias 216 can be provided by a spring or other biasing mechanism.

First panel 206 includes a stop 218 and retention mechanism 220 (four retention mechanisms are illustrated). Stop 218 is illustrated as a finger-like extension from first panel 206 to a position under the first position 214 of latch 210. Thus, stop 218 can interact with operation of latch 210, preventing transition from one position to another. For example, stop 218 can prevent latch 210 from pivoting from the first position 214 to a second position (e.g., second position 116 illustrated in FIG. 1). Stop 218 can be adapted to prevent other types of transitions, e.g., transitions involving sliding, depressing, rotating, or other movements. Stop 218 can be associated with other positions, including idle position 212 and additional positions not illustrated in FIG. 2.

Stop 218, illustrated as a finger-like extension of first panel 206, extends into a region of second panel 208 and an operational area of latch 210. Thus, because stop 218 is a part of first panel 206, stop 218 can be removed with removal of first panel 206. Accordingly, stop 218 can prevent latch 210 from transitioning from first position 214 to a second position, until the first panel 206 is removed along with stop 218. In alternate embodiments, stop 218 can be part of housing 204, second panel 208, or other components of computing system 200. For example, stop 218 can be mounted to housing 204 to react to the presence and absence of first panel 206. Thus, removal or installation of first panel 206 is communicated to the stop 218, and stop 218 can be selectively positioned to affect operation of latch 210. Stop 218 can be positioned to selectively limit the number of available positions and functions associated with latch 212. As illustrated in FIG. 2, stop 218 has enabled latch 210 to operate as a two-position latch by blocking pivoting (or depressing) of latch 212 from first position 214 to a second position (e.g., second position 116 illustrated in FIG. 1). Removing stop 218 from the operational path of latch 210, such as by removing first panel 206, enables latch 210 to operate with additional positions and functions.

Retention mechanism 220 can include a hook portion 222 and a slide portion 224 to slidably position and retain first panel 206 in housing 204, although other mechanisms are possible for retaining first panel 206. Retention mechanism 220 is compatible with operation of latch 210, such that first panel 206 is secured when switch 210 is in the idle position 212. First panel 206 is removable when the latch 210 is in the first position 214, enabling the first panel 206 to be moved in a downward direction (as oriented in FIG. 2) to align hook 222 with slide 224 to disengage first panel 206 from housing 204. Retention mechanism 220 also can be used to retain second panel 208 or additional panels, although other mechanisms are possible for retaining panels.

Figure 3:
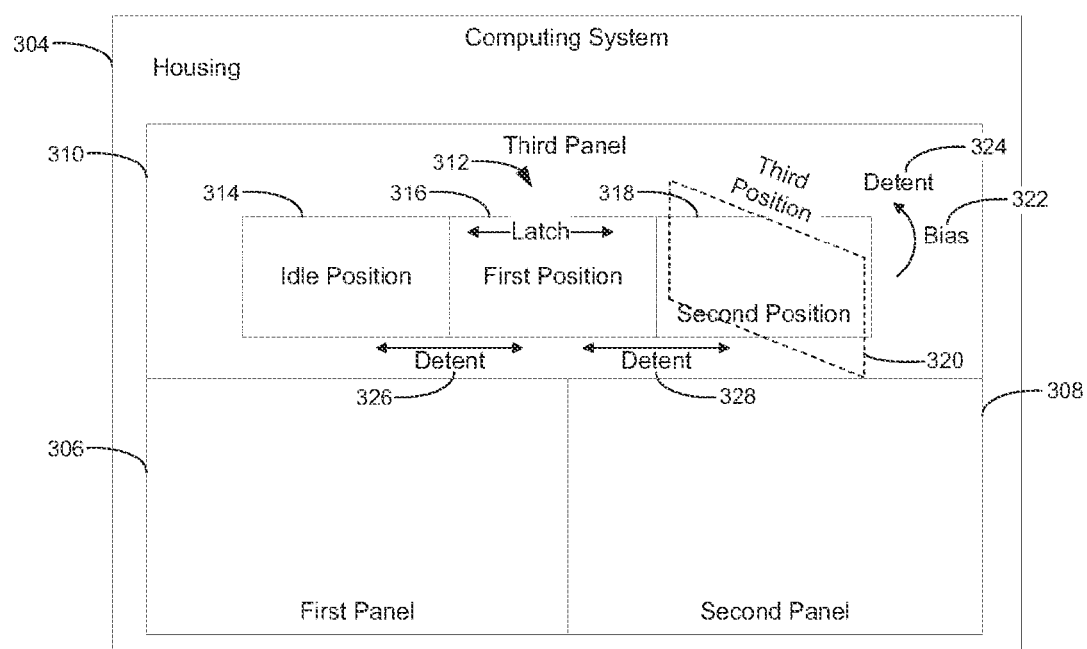
FIG. 3 is a block diagram of a computing system including a latch and panels according to an example.

FIG. 3 is a block diagram of a computing system 300 including a latch and panels according to another example. Computing system 300 includes housing 304, first panel 306, second panel 308, third panel 310, and latch 312. Latch 312 includes idle position 314, first position 316, second position 318, and third position 320.

Latch 312 can slide between idle position 314, first position 316, and second position 318. Latch 312 can pivot between second position 318 and third position 320. As illustrated, latch 312 includes bias 322 to bias latch 312 from third position 320 toward second position 318. Bias 322 also provides a resistance to stabilize the latch 312 from pivoting into the third position 320 when in the second position 318.

Latch movement and positions can be associated with detents to provide varying resistance to movement and audible and/or tactile feedback. For example, detent 324 can be associated with second position 318 and third position 320 along a pivot. Detent 326 and detent 328 can be associated with idle position 314, first position 316, and second position 318 along a slidable path. Detents can indicate when the latch 312 is aligned with a position, or when it departs from alignment with a position. Similarly, detents can be used with other latch configurations, such as when the latch 312 is pivotable, rotatable, depressible, or otherwise movable.

Computing system 300 can include stops (not shown in FIG. 3) similar to stop 218 of FIG. 2 and associated with transitions of latch 312 from one position to another. For example, a first stop associated with first panel 306 can prevent the latch 312 from transitioning from first position 316 to second position 318 until the first panel 306 is removed. Similarly, a second stop associated with second panel 308 can prevent the latch 312 from transitioning from second position 318 to third position 320 until the second panel 308 is removed.

Latch 312 can provide multiple functions and positions, while using stops to selectively provide simple and intuitive initial usability. Additional positions, usability, and functionality are available as stops are removed from the operational path of latch 312 (e.g., when a panel associated with a stop is removed).

Figure 4:
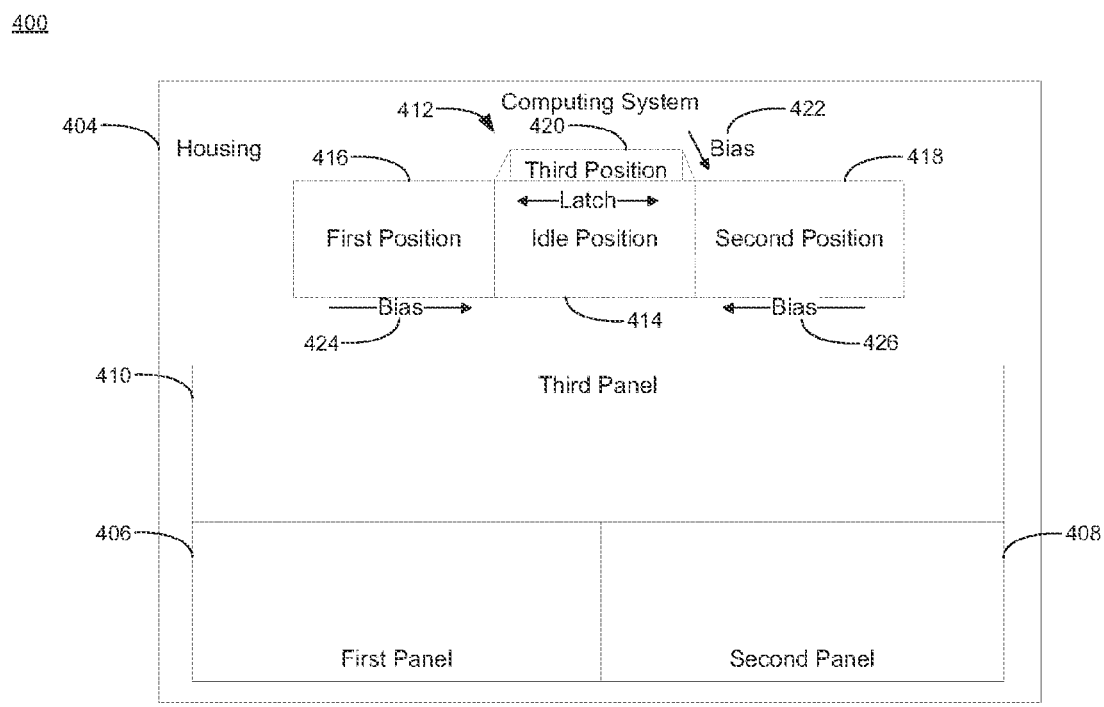
FIG. 4 is a block diagram of a computing system including a latch and panels according to an example.

FIG. 4 is a block diagram of a computing system 400 including a latch and panels according to yet another example. Computing system 400 includes housing 404, first panel 406, second panel 408, third panel 410, and latch 412. Latch 412 is located on a surface of housing 404, although latch 412 can be located in any of first panel 406, second panel 408, or third panel 410. Latch 412 may also be located on a side of housing 404, i.e., on a different plane than first panel 406, second panel 408, and third panel 410. In alternate embodiments, latches and/or panels also can be positioned on a side, top, or other surface of computing system 400.

Latch 412 includes idle position 414, first position 416, second position 418, and third position 420. In the example of FIG. 4, first position 416, second position 418, and third position 420 are associated with a single independent movement of latch 412 from idle position 414. Thus, each position of latch 412 can be reached from the idle position 414 without requiring operation through another position. Latch 412 is movable between positions such that latch 412 is depressible between idle position 414 and third position 420, and latch 412 is slidable between idle position 414, first position 416, and second position 418. Alternate modes of operation are possible, such as rotating, pivoting, etc.

Latch 412 can be biased toward a default position. As illustrated, bias 422 biases latch 412 from third position 420 to idle position 414. Bias 424 biases latch 412 from first position 416 to idle position 414. Bias 426 biases latch 412 from second position 418 to idle position 414. Thus, latch 412 assumes the default idle position 414 when released.

A latch position can be associated with a function for sequential operation. For example, idle position 414 can retain first panel 406, second panel 408, and third panel 410. First position 416 can release first panel 406 and retain second panel 408 and third panel 410. Second position 418 can release second panel 408 and retain first panel 406 and third panel 410. Third position 420 can release third panel 410 and retain first panel 406 and second panel 408.

A latch position can be associated with multiple functions for parallel operation. For example, idle position 414 can retain first panel 406, second panel 408, and third panel 410. First position 416 can release first panel 406 and retain second panel 408 and third panel 410. Second position 418 can release first panel 406 and second panel 408, and retain and third panel 410. Third position 420 can release first panel 406, second panel 408, and third panel 410. Additional combinations of sequential and/or parallel operations/positions are possible, and latch 412 can include detent(s) associated with latch positions and/or transitions.

At least one stop can be used with the panels and transitions between positions. For example, in alternate examples, a first panel stop can be positioned between the idle position 414 and the second position 418. A second panel stop can be positioned between the idle position 414 and the third position 420. Operation of latch 412, using first and second panel stops described above, is selectively limited to the idle position 414 and the first position 416 by the first panel stop until the first panel 406 (and associated first panel stop) is removed. Similarly, operation of latch 412, in an alternate example using first and second panel stops, is selectively limited to idle position 414, first position 416, and second position 418 by the second panel stop until removal of the second panel 408.

Figure 5:
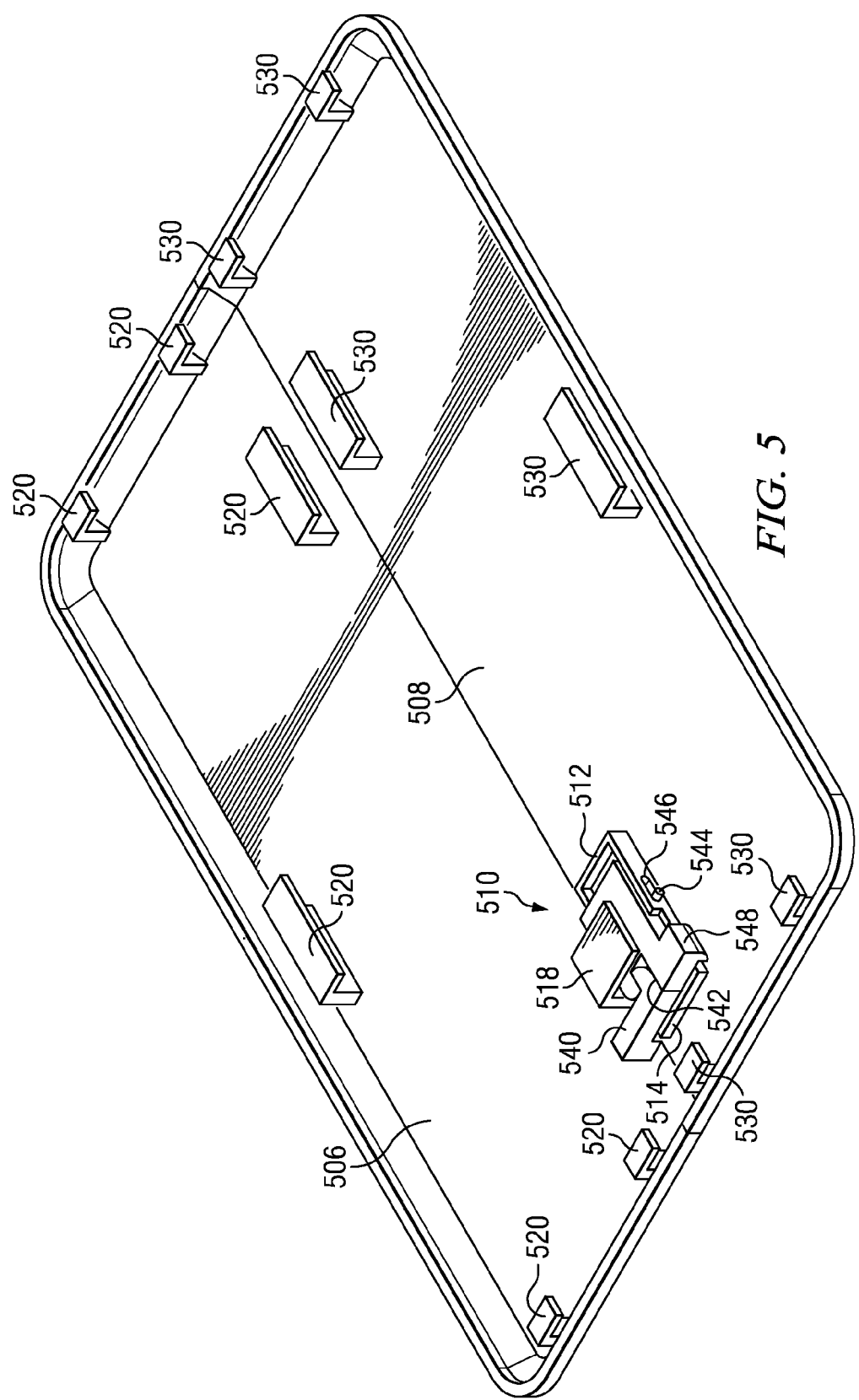
FIG. 5 is a perspective view of a latch and panels according to an example.

FIG. 5 is a perspective view of a latch and panels according to an example. First panel 506 and second panel 508 are associated with latch 510. First panel 506 includes first panel retention mechanisms 520, panel arm 540, and first panel stop 518. Second panel 508 includes second panel retention mechanisms 530 and latch 510.

Latch 510 includes a latch cutout 542, latch axle 544, and latch arm 548. Latch 510 may be slidable between idle position 514 and first position 512. Latch 510, and/or second panel 508, may include a latch housing to support and guide latch 510, to facilitate positioning of latch 510. Latch 510 and/or the latch housing may include a track 546 associated with latch axle 544. Latch arm 548 is to interact with an element of a computer housing (e.g., housing arm 860 illustrated in FIG. 8), to retain second panel 508 (e.g., while latch 510 is in idle position 514 and first position 512).

Latch 510 in the idle position 514 retains first panel 506 with respect to second panel 508. Latch cutout 542 engages panel arm 540 such that panel arm 540 is retained when latch 510 is in the idle position 514. Latch 510 may be biased toward the idle position 514. Latch 510, and/or panel arm 540, may include curved or slanted portions that cooperate with each other during installation of first panel 506. First panel retention mechanisms 520, second panel retention mechanisms 530, and first panel stop 518 may include similar slanted/curved surfaces to facilitate interactions. Latch 510 may be displaced from the idle position 514 by the slanted portions of latch 510 and panel arm 540 contacting each other when first panel 506 is moved toward second panel 508. When the first panel 506 is in place, the latch 510 can snap back into place at the idle position 514, with latch cutout 542 accommodating and retaining a portion of panel arm 540. Latch 510 may slide back and forth between idle position 514 and first position 512 in the presence of first panel stop 518. First panel stop 518 may prevent latch 510 from being pivoted about latch axle 544.

FIG. 6A is a perspective view of a latch and panels according to an example. First panel 606 and second panel 608 are associated with latch 610. First panel 606 includes first panel retention mechanisms 620, panel arm 640, and first panel stop 618. Second panel 608 includes second panel retention mechanisms 630 and latch 610.

Latch 610 includes a latch cutout 642, latch axle 644 associated with track 646, and latch arm 648. Latch 610 may be slidable between idle position 614 and first position 612. Latch arm 648 is to interact with an element of a computing system housing (e.g., housing arm 860 illustrated in FIG. 8), to retain second panel 608 with respect to the computing system housing. Latch 610 is shown in first position 612, allowing latch cutout 642 to disengage panel arm 640.

Figure 6B:
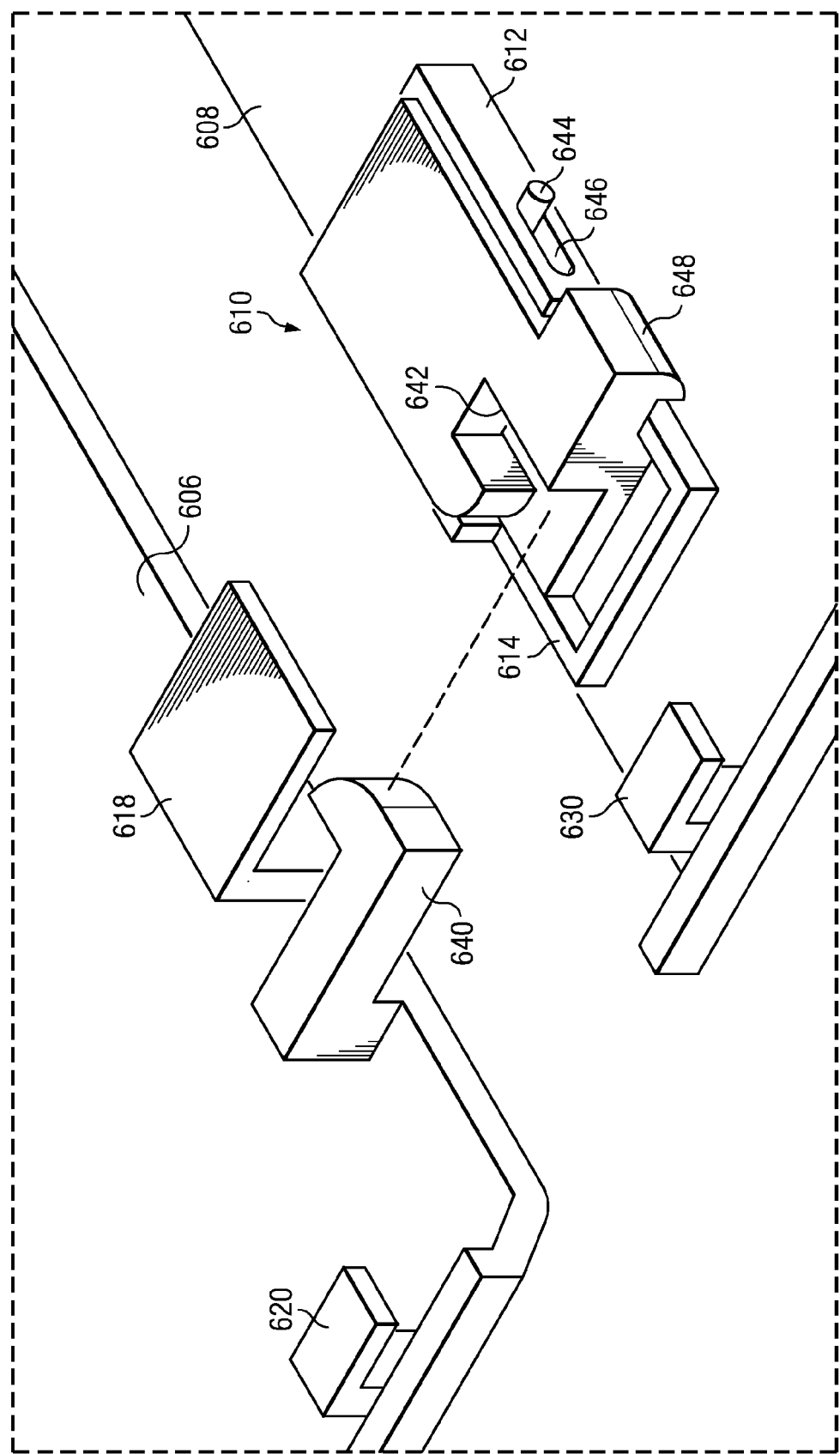
FIG. 6B is a perspective view of a latch and panels of FIG. 6A in greater detail.

FIG. 6B is a perspective view of the latch and panels of FIG. 6A in greater detail. Latch 610 is displaced from the idle position 614 and is shown in the first position 612. Panel arm 640 is disengaged from latch cutout 642, and first panel 606 is separated from second panel 608 such that first panel retention mechanisms 620 may allow removal of first panel 606 from a computing system. Second panel 608 is retained by second panel retention mechanisms 630, with sliding movement of second panel 608 prevented by latch arm 648 interacting with, e.g., housing arm 860 (not shown in FIG. 6B, see FIG. 8). Latch arm 648 is shown resting on a raised portion of a latch housing support wall, leaving a gap to accommodate, e.g., housing arm 860 (as shown in FIG. 9 regarding housing arm 960).

An extent of slidable movement of latch 610 may be constrained by latch axle 644 sliding in track 646, and may also be constrained by a cutout in second panel 608 and/or by a latch housing raised support wall(s). Latch 610 may be movable such that latch cutout 642 can move out of the way of panel arm 640, allowing removal of first panel 606. Panel stop 618 may prevent pivoting of latch 610, and may prevent pivoting regardless of a position of latch 610 between idle position 614 and first position 612. Removal of first panel 606 (and associated panel stop 618) enables the latch 610 to be pivoted. Latch 610 may be biased about the axle 644 to a non-pivoted position, and may be biased along the slidable path to the idle position 614.

Figure 7:
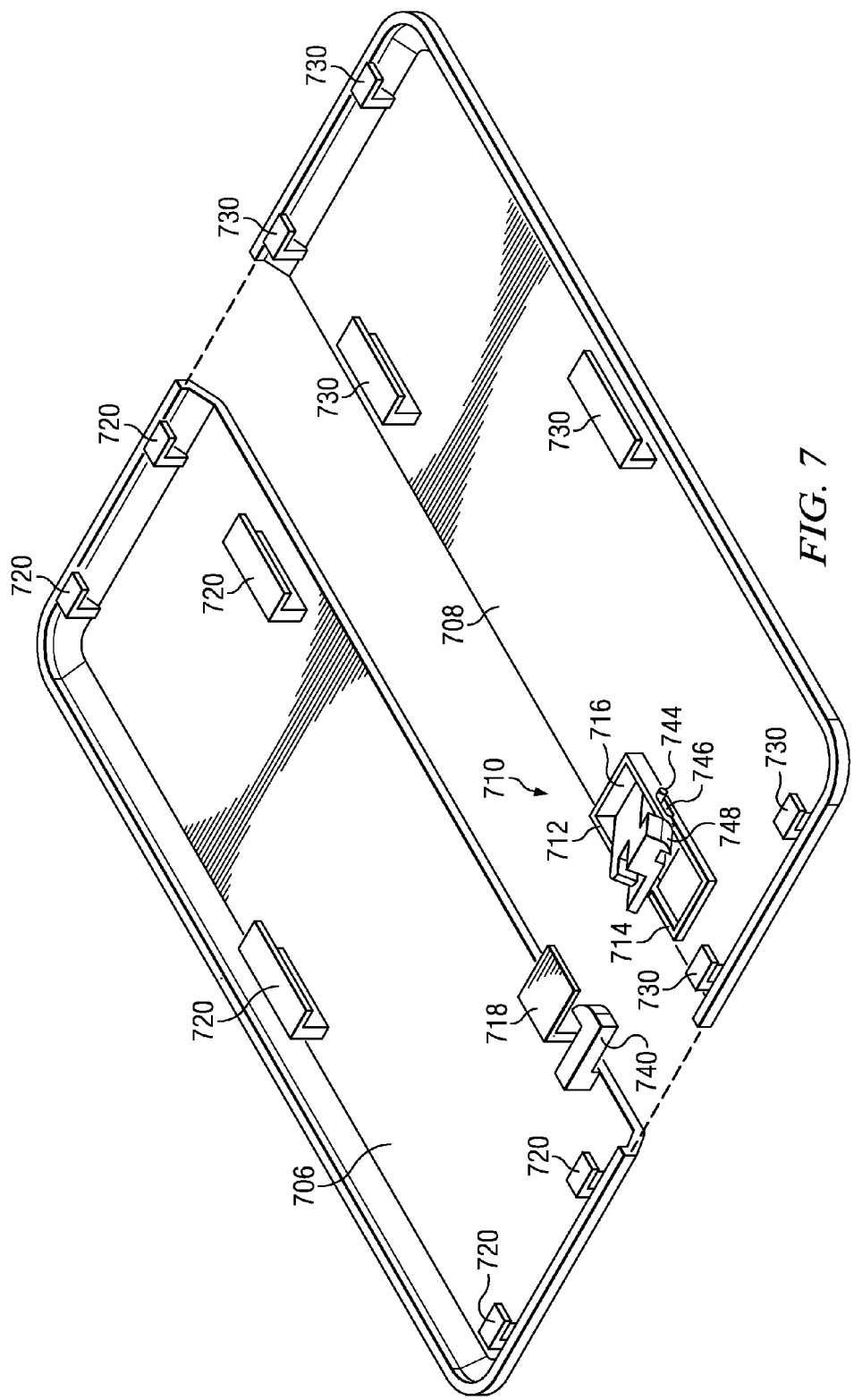
FIG. 7 is a perspective view of a latch and panels according to an example.

FIG. 7 is a perspective view of a latch and panels according to an example. Panel arm 740 is disengaged and first panel 706 is separated from second panel 708, such that first panel 706 and first panel retention mechanisms 720 may be removed from a computing system, and panel stop 718 is not positioned to constrain the pivoting of latch 710. Latch 710, including axle 744 within track 746, is shown displaced from the idle position 714 to the first position 712. Latch 710 is also shown pivoted about axle 744 to the second position 716. Latch arm 748 is pivoted into a disengaged position, such that second panel 708 and second panel retention mechanisms 730 may be removed from a computing system.

Figure 8:
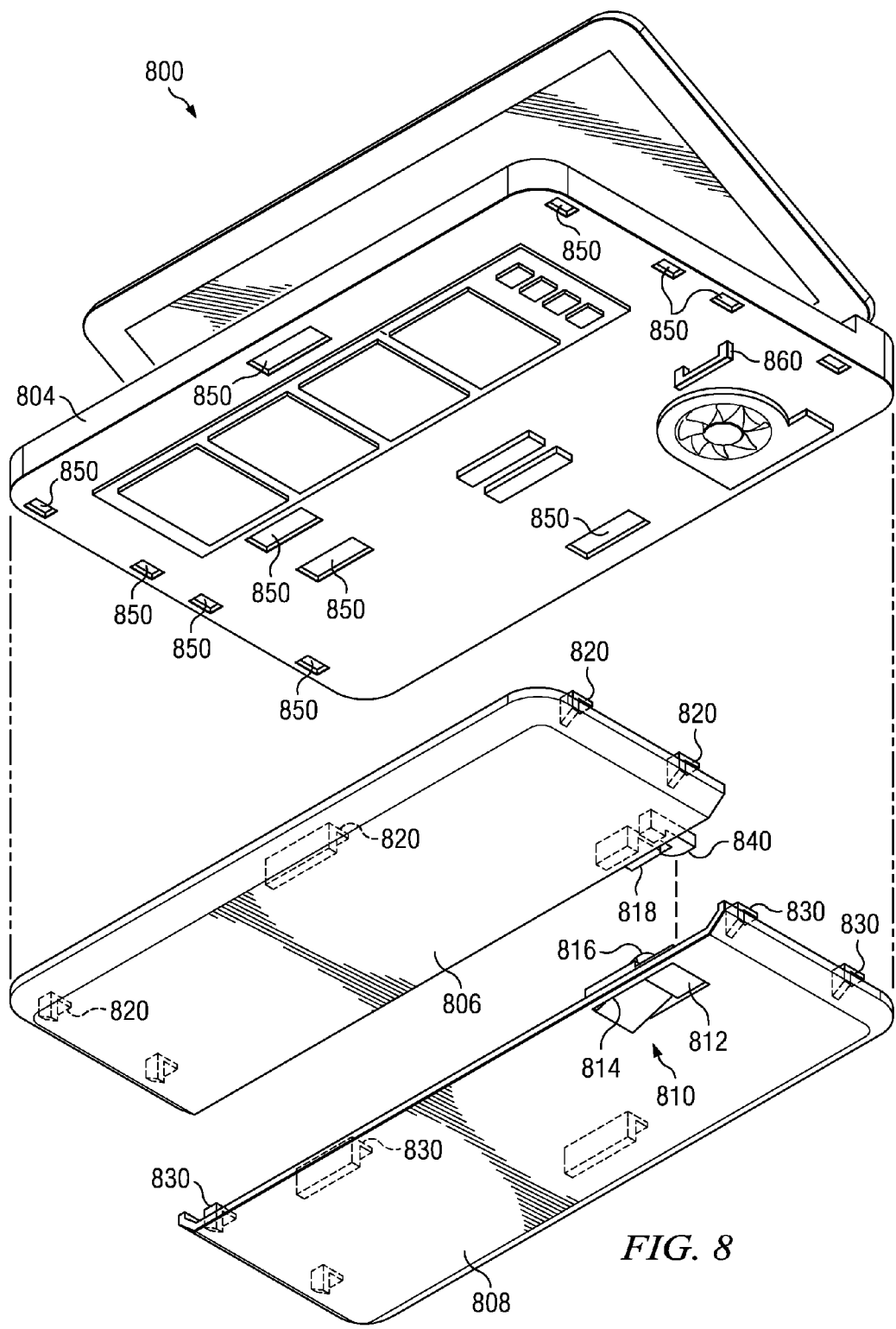
FIG. 8 is a perspective view of a computing system including a latch and panels according to an example.
Figure 9:
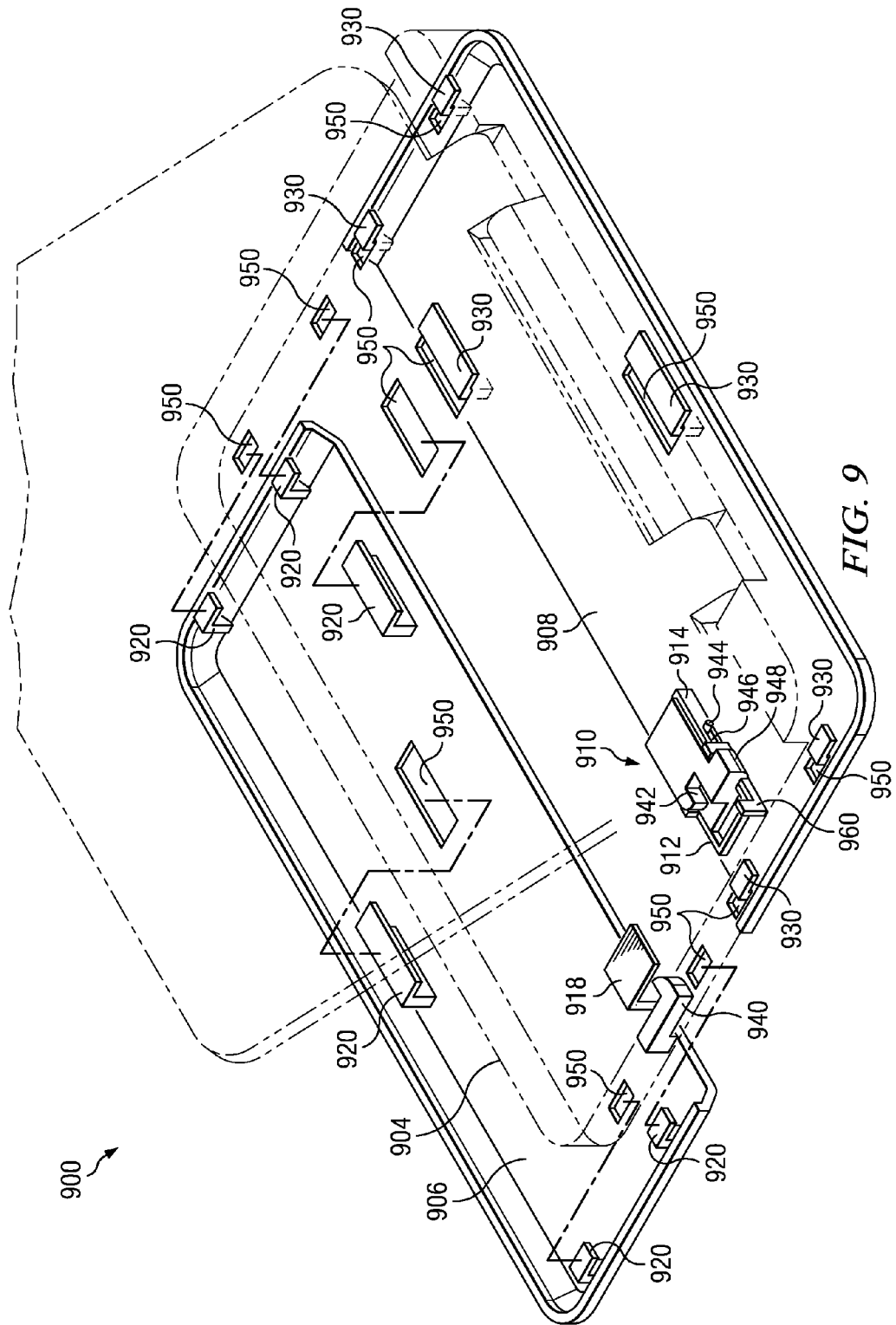
FIG. 9 is a perspective view of a computing system including a latch and panels according to an example.

FIG. 8 is a perspective view of a computing system 800 including a latch and panels according to an example. Housing 804 of computing system 800 is shown including retention mechanism slides 850, to interact with first panel retention mechanisms 820 and second panel retention mechanisms 830. Housing 804 includes a housing arm 860 to interact with a latch arm (not visible, see latch arm 748 shown in FIG. 7). Housing arm 860 can enable the latch arm to engage and retain a portion of the housing 804. Thus, the second panel 808 is prevented from sliding with respect to the housing 804 to disengage second panel retention mechanisms 830 from housing 804, preventing removal of second panel 808 from housing 804 unless latch 810 is in the second position 816.

Latch 810 is shown displaced into the first position 814 and pivoted into the second position 816. First panel 806 is removed from housing 804, such that panel arm 840 and panel stop 818 are not in contact with latch 810. Latch 810 includes a latch stop 812. Latch stop 812 may prevent the latch 810 from being pivoted into the second position 816, even when first panel 806 is removed and/or when panel stop 818 is not in contact with latch 810. When latch 810 is displaced from an idle position to the first position 814, latch 810 can clear the latch stop 812 and be pivoted into the second position 816 when first panel 806 and panel stop 818 is removed. In alternate examples, panel stop 818 may be omitted entirely. Thus, latch stop 812 may prevent latch 810 from being pivoted from the idle position, even when first panel 806 is removed (and when panel stop 818 is omitted).

FIG. 9 is a perspective view of a computing system 900 including a latch and panels according to an example. Housing 904 of the computing system 900 is shown including retention mechanism slides 950, to interact with first panel retention mechanisms 920 and second panel retention mechanisms 930. Second panel 908 is shown retained on housing 904. Housing arm 960 is in contact with and retained by latch arm 948. Thus, the second panel 908 is prevented from sliding with respect to the housing 904, and second panel retention mechanisms 930 are engaged within corresponding retention mechanism slides 950. First panel 906 is shown removed such that panel arm 940 and panel stop 918 are not in contact with latch 910.

Latch 910 is shown displaced into the first position 914 to allow removal or installation of first panel 906. Latch arm 948 is engaged with housing arm 960, regardless of the displacement of latch 910 between the idle position 912 and the first position 914. Latch 910 may be slidably displaced by the action of the slanted portion of cutout 942 and panel arm 940. Similarly, latch 910 may be pivotally displaced by the action of the slanted portion of latch arm 948 and housing arm 960. The latch 910 may be biased slidably and pivotally toward the idle position 912. For example, a spring associated with latch track 946 may slidably bias the latch axle 944, and a spring positioned around the latch axle 944 may pivotally bias the latch 910. Thus, second panel 908 may be installed on housing 904 and retained by latch 910 without a need to manipulate latch 910. Similarly, first panel 906 may be installed on housing 904 and retained by latch 910 without a need to manipulate latch 910. As illustrated in FIG. 9, Second panel 908 may be installed by inserting the second panel retention mechanisms 930 upward into corresponding retention mechanism slides 950, and then sliding second panel 908 toward housing arm 960 to allow latch arm 948 of latch 910 to engage and retain housing arm 960. First panel 906 may be installed by inserting the first panel retention mechanisms 920 upward into corresponding retention mechanism slides 950, and then sliding first panel 906 toward second panel 908 to allow panel arm 940 to engage and be retained by latch 910.

In alternate examples, a location of latch arm 948 and housing arm 960 may be repositioned with respect to the latch 910, and may take other forms. For example, the latch arm 948 and housing arm 960 may be repositioned on latch closer toward the first position 914, on an opposite side of the latch axle 944. Housing arm 960 may be a tab instead of an arm. Thus, instead of the latch arm 948 having a downward facing hook that pivots upward to disengage housing arm 960, the example alternate latch arm would include an upward facing hook to engage a repositioned housing arm, such that the alternate latch arm would pivot downward with the latch 910 to disengage the repositioned housing arm.

Figure 10:
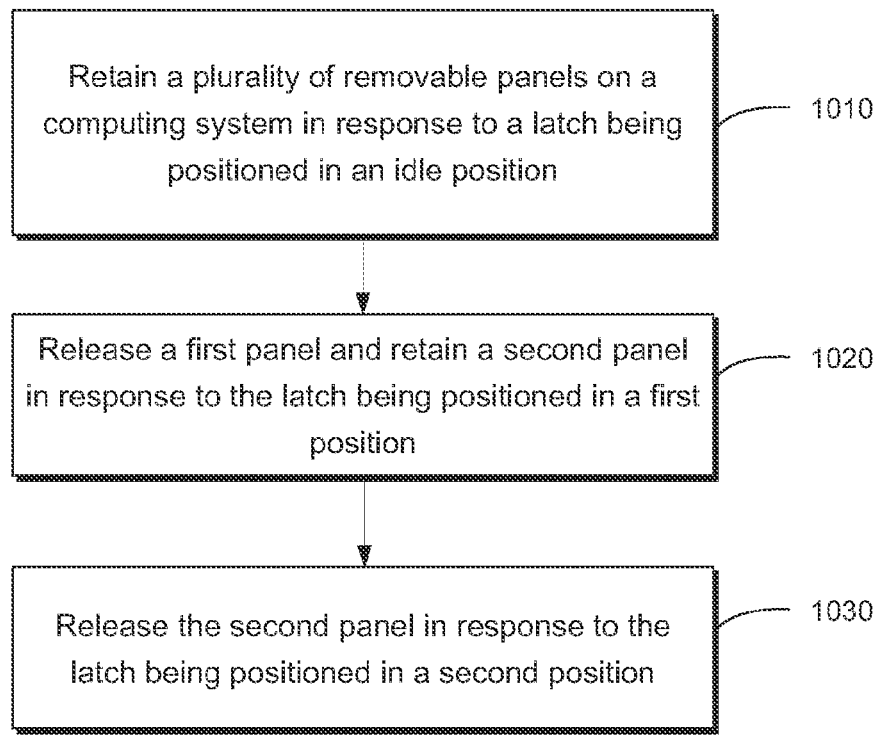
FIG. 10 is a flowchart based on operation of a latch and panels according to an example.

FIG. 10 is a flowchart 1000 based on operation of a latch and panels according to an example. In step 1010, a plurality of removable panels are retained on a computing system in response to a latch being positioned in an idle position. In step 1020, a first panel is released and a second panel is retained in response to the latch being positioned in a first position. In step 1030, the second panel is released in response to the latch being positioned in a second position.

The breadth and scope of the present features should not be limited by any of the above-described examples, but should be defined only in accordance with the following claims and their equivalents.

What is claimed is:

1. A computing system comprising:
    a plurality of removable panels installable on the computing system; and
    a latch positionable in a plurality of positions including an idle position to prevent removal of a first panel and a second panel, a first position to enable removal of the first panel and prevent removal of the second panel, and a second position to enable removal of the first panel and the second panel.

2. The computing system of claim 1, wherein the latch is slidable between the idle position and the first position.

3. The computing system of claim 2, wherein the latch is depressible between the first position and the second position.

4. The computing system of claim 2, wherein the latch is pivotable between the first position and the second position.

5. The computing system of claim 1, wherein the latch is disposed in a housing of the computing system.

6. A computing system, comprising:
    a latch including an idle position, a first position, and a second position;
    a removable first panel that is secured to the computing system if the latch is in the idle position; and
    a removable second panel that is secured to the computing system if the latch is in the idle position and the first position.

7. The computing system of claim 6, wherein the first panel is associated with a battery compartment.

8. The computing system of claim 6, wherein the second panel is associated with a memory compartment.

9. The computing system of claim 6, further comprising a plurality of retention mechanisms associated with the first panel and the second panel.

10. The computing system of claim 6, further comprising a detent associated with the latch.

11. A method, comprising:
    retaining a plurality of removable panels on a computing system in response to a latch being positioned in an idle position;
    releasing a first panel and retaining a second panel in response to the latch being positioned in a first position; and
    releasing the second panel in response to the latch being positioned in a second position.

12. The method of claim 11, further comprising preventing transition of the latch from the first position to the second position while the first panel is installed on the computing system, based on a stop associated with the first panel.

13. The method of claim 11, further comprising biasing the latch toward the idle position.

14. The method of claim 11, wherein the latch is disposed in the second panel.

15. The method of claim 11, further comprising:
    retaining a third panel in response to the latch being positioned in the idle position, the first position, and the second position; and
    releasing the third panel in response to the latch being positioned in a third position.

* * * * *